United States Patent [19]

Grogan

[11] 3,940,634

[45] Feb. 24, 1976

[54] SOLID STATE AC POWER RELAY

[75] Inventor: Martin L. Grogan, Cedar Rapids, Iowa

[73] Assignee: Rockwell International Corporation, El Segundo, Calif.

[22] Filed: Feb. 14, 1975

[21] Appl. No.: 550,062

[52] U.S. Cl. ... 307/252 UA; 307/252 B; 307/252 N; 307/252 T; 307/311; 317/128; 317/148.5 B
[51] Int. Cl.² ........................................ H03K 17/56
[58] Field of Search ............ 317/124, 128, 148.5 B; 307/117, 252 UA, 252 T, 252 B, 311; 323/18, 21

[56] References Cited
UNITED STATES PATENTS 3,723,769 3/1973 Collins ............................ 307/252 T
3,848,140 11/1974 Guermeur et al. .................. 307/311

Primary Examiner—J. D. Miller
Assistant Examiner—Harry E. Moose, Jr.
Attorney, Agent, or Firm—Howard R. Greenberg; Robert J. Crawford

[57] ABSTRACT

A trigger type device employing a pair of oppositely poled SCR's or a triac, provides bidirectional control of AC power through a simple circuit comprising a pair of rectifying diodes and an opto-electronic coupler.

6 Claims, 2 Drawing Figures

SOLID STATE AC POWER RELAY

BACKGROUND OF THE INVENTION

The invention disclosed herein pertains generally to AC power relays and specifically to a solid state implementation thereof. The invention was made under or in the course of a contract with the Department of the united States Air Force.

The development and ready availability of various solid state electronic devices has stimulated an interest in a viable solid state replacement for the old reliable electromagnetic relay for controlling the flow of AC power while affording electrical isolation between the switching path and the actuating control elements. The distinct advantages in faster operating time, smaller and cheaper fabrication and greater reliability to be achieved with a solid state design are all well recognized. Although a number of solid state AC power relays have been developed, they exhibit a certain degree of unnecessary complexity which engenders a level of sophistication uncalled for in many applications and consequently economically militates against their usage. These relays, which normally employ some type of trigger device such as an SCR or a triac, are quite often copiously designed to ensure triggering the device into conduction as close to the AC zero crossings as possible in order to avoid undesirable signal interference effects resulting from high inrush currents and ringing. In addition to increasing fabrication cost and size, these overdesigns also result in higher power dissipation losses during the off-state of the relay.

With the foregoing in mind, it is a primary object of the present invention to provide a new and improved solid state AC power relay which employs a trigger type device whose control is effectuated through a simple circuit design.

It is a further object of the present invention to provide such a new and improved solid state AC power relay which ensures conduction essentially at the AC zero crossings and which minimizes power dissipation during the off-state of the relay.

The foregoing objects as well as others and the means by which they are achieved by the present invention may best be appreciated by referring to the Detailed Description of the Invention which follows hereinafter, together with the drawings.

BRIEF DESCRIPTION OF THE INVENTION

The solid state AC power relay of the invention employs a bidirectional trigger switching means such as a triac or a pair of oppositely poled SCR's to control the flow of AC power. Gate current for triggering the means into conduction during each AC alternation is supplied from the AC power source through a pair of rectifying diodes under the control of an optoelectronic coupler which affords electrical isolation between the actuating control elements (connected to the light emitting diode of the coupler) and the AC switching path.

In the preferred embodiments disclosed herein, the phototransistor of the coupler supplies an input signal to an amplifier whose output ensures the development of sufficient gate current to trigger the switching means into conduction. An RC charging circuit is connected in series with the phototransistor to ensure conduction essentially at the AC zero crossings while minimizing the power dissipation losses during the off-state of the relay.

DETAILED DESCRIPTION OF THE INVENTION

Figure 1:
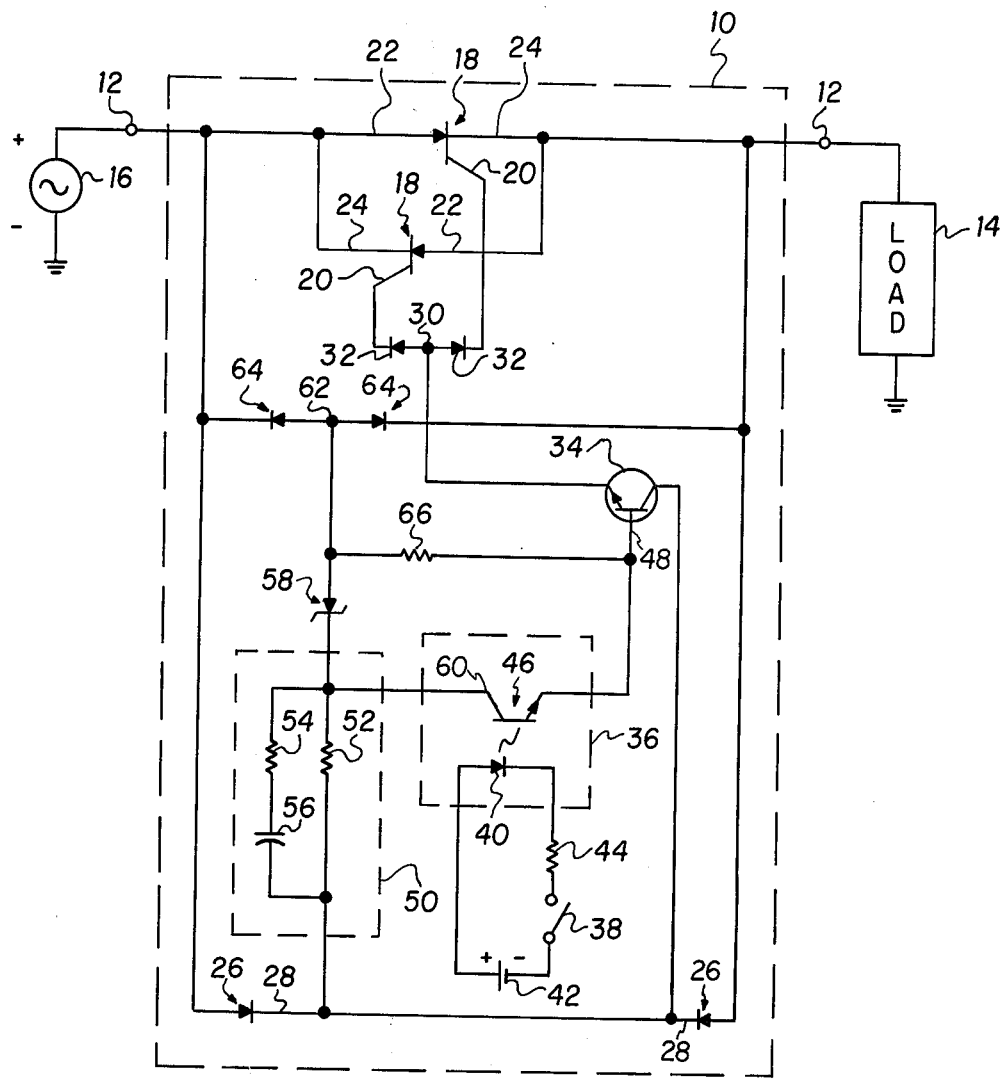
FIG. 1 is a schematic diagram of the invention employing a pair of oppositely poled SCR's as the bidirectional trigger switching means.

As shown in FIG. 1, the solid state relay of the invention, designated generally by the numeral 10, has a pair of power terminals 12 for interconnecting an AC load 14 with an AC power source 16 through a pair of oppositely poled silicon control rectifiers (SCR's 18). The SCR's 18 constitute a bidirectional switching means for controlling the flow of power from the AC power source 16 to the load 14 by blocking current from passing between power terminals 12 when the relay 10 is deactuated (off-state) and passing current when the relay 10 is actuated (on-state). Thus, when the relay 10 is actuated and the AC voltage alternations generated by the power source 16 are positive (as defined by the polarity shown), current passes from the left power terminal 12 to the right through the anode-cathode junction of the upper SCR 18 while during the negative AC alternations the current reverses, passing through the anode-cathode junction of the lower SCR 18. As is well known, the SCR 18 is a trigger type device which is triggered into conduction by the application of a current into its gate 20 when its anode 22 is positive with respect to its cathode 24. Once conduction is initiated, the SCR 18 remains conductive during the remainder of the AC alternation irrespective of whether or not gate current is present thereafter. In the design of FIG. 1 at each AC zero crossing, one SCR 18 turns on at the beginning of an AC alternation while the other SCR 18 turns off at the end of the preceding AC alternation.

Gate current for triggering the SCR's 18 into conduction during each AC alternation is provided to their respective gates 20 from the AC power source 16 via a pair of rectifying diodes 26 which are connected in series between the power terminals 12 and have their cathodes 28 connected in common to the commonly connected anodes 30 of a pair of diodes 32 through the collector-emitter junction of a transistor 34. Since each diode 32 is connected to a different gate 20 of the SCR's 18, it will be readily seen that when the transistor 34 is forward-biased for conduction (such as at the beginning of each AC alternation, to be explained shortly) as it would be only during the on-state of the relay, the AC power source 16 supplies gate current to the upper SCR 18 to trigger it into conduction through the right diode 32 and the left diode 26 during positive AC alternations and to the lower SCR 18 to trigger it into conduction through the left diode 32 and the right diode 26 during negative AC alternations. Once conduction through an SCR 18 begins, the resultant low voltage drop across the anode-cathode junction of the conducting SCR 18 deprives the transistor 34 of sufficient voltage to maintain conduction therethrough and so the transistor 34 turns off thereby terminating the flow of gate current until the next AC alternation. The two diodes 32 protect the SCR's 18 from excessive reverse-bias voltages during the off-state of the relay 10 to avoid damaging them.

The relay 10 is initially actuated to provide a base drive for forward biasing transistor 34 through an optoelectronic coupler 36 by closure of a switch 38 which permits the coupler light-emitting diode 40 to be energized from a DC source such as battery 42 via a current limiting resistor 44. The phototransistor 46 of coupler 36 is connected between the base 48 of transistor 34 and the commonly connected cathodes 28 of diodes 26 through an RC charging circuit 50 comprising a resistor 52 connected in parallel with the series combination of a resistor 54 and a capacitor 56. When the light-emitting diode 40 is energized, the AC power source 16 is enabled to supply base current drive to the transistor 34 for forward biasing it via the phototransistor 46 and the rectifying diodes 26 (the left diode 26 conducting during positive AC alternations and the right diode 26 conducting during negative AC alternations). One of the SCR's 18 is initially rendered conductive by base current passing through the parallel paths of charging circuit 50, which SCR 18 and current division being determined respectively by the AC alternation and the point within the AC alternation at which the switch 38 is closed. Thereafter, once steady-state operation is achieved the SCR's 18 are alternately triggered into conduction by driving transistor 34 into conduction with a base current that passes through the series combination of resistor 54 and capacitor 56 at each AC zero crossing. This series combination provides a low impedance path for driving the transistor 34 quickly into conduction at the beginning of each AC alternation (within one degree of the 180° half-cycle) to trigger the appropriate SCR 18 into conduction at that time. This will normally occur by the time that the AC power source achieves a voltage of 1–2 volts. As mentioned earlier, once an SCR 18 begins conducting during each AC alternation, the transistor 34 turns off because of insufficient voltage to drive it. At that time, capacitor 56 which had been charging via resistor 54 since the beginning of the AC alternation begins discharging through resistors 52 and 54 to achieve a zero voltage across its plates before the next AC zero crossing. This ensures a low impedance base current path at the beginning of each AC alternation for turning the transistor 34 on quickly and consequently the SCR's 18.

When the load 14 is supplied from an AC power source 16 of high voltage, the phototransistor 46 may be protected from excessive voltages which could otherwise damage it through a zener diode 58, which is connected between its collector 60 and the commonly connected anodes 62 of a pair of diodes 64 which are serially connected between the power terminals 12. To ensure proper circuit operation, the zener breakdown voltage should be less than that voltage which would damage the phototransistor 46 (which normally might be around 30 volts), but greater than the AC power source voltage at which the SCR's 18 are rendered conductive (around 1–2 volts). A resistor 66 is connected between the base 48 of transistor 34 and the commonly connected anodes 62 to provide a leakage path for rapidly turning the transistor 34 off during each alternation at the time an SCR 18 begins conducting.

By the judicious selection of component values for the charging circuit 50, the capacitor 56 charge/discharge time requirements can be met to ensure triggering the SCR's 18 into conduction essentially at the AC zero crossings when the relay 10 is actuated, while still minimizing the power dissipation arising from current flow through the phototransistor 46 zener protection circuitry when the relay 10 is deactuated. For example, using typical commercial solid state components and the following charging circuit 50 component values:

resistor 52=30 kilohms
resistor 54=100 ohms
capacitor =0.1 microfarads the SCR's 18 of relay 10 were triggered into conduction within one degree of each AC alternation for an AC frequency range of approximately 50–400 Hz. While the relay off-state power dissipation amounted to no more than .3 watts for an AC power supply voltage of 120 volts. Prior art solid state relays exhibit equivalent power dissipations of 2–3 times this amount for the same operating conditions.

Figure 2:
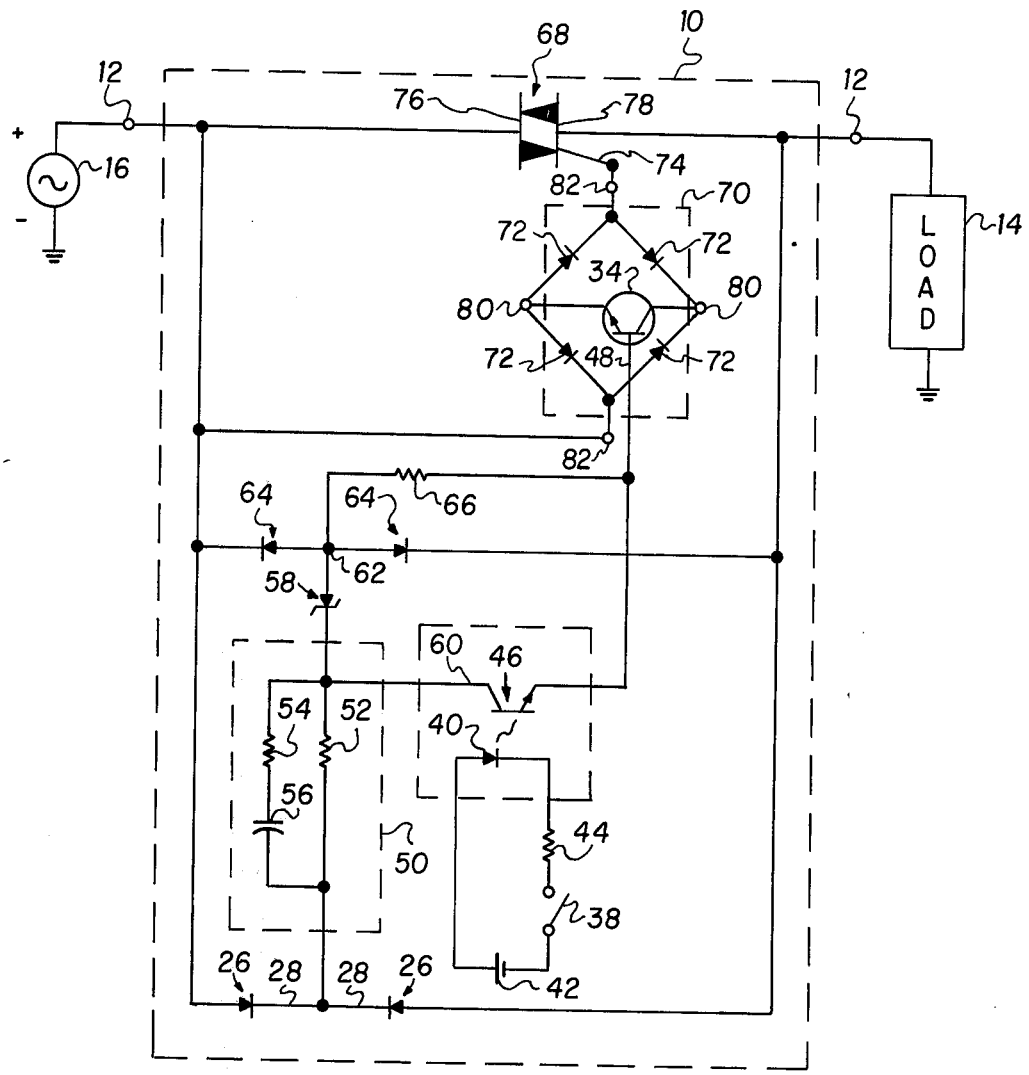
FIG. 2 is a schematic diagram of a second embodiment of the invention employing a triac as the bidirectional trigger switching means.

A second embodiment of the invention is shown in FIG. 2 wherein the SCR's 18 have been replaced with a triac 68 and the diodes 32 have been replaced by a full-wave rectifying bridge 70 consisting of diodes 72 to channel gate current through transistor 34 into or out of the triac gate 74. As is well known, gate current into gate 74 during positive AC alternations will cause current to flow from the triac non-referenced main terminal 76 to its referenced main terminal 78, while gate current out of gate 74 during negative AC alternations will cause the reverse current flow. It will be readily seen that with the exception of connecting the collector-emitter junction of transistor 34 across the DC ports 80 of the bridge 70, the remainder of the relay 10 of FIG. 2 is exactly the same as that of FIG. 1 as is its operation (the same numbers being used to identify the same elements in both figures). Thus, the phototransistor 46 supplies base current at the beginning of each AC alternation to render transistor 34 conductive which then triggers the triac 68 into conduction; during positive AC alternations, current flows into the lower AC port 82 of the bridge 70 which is connected to the non-referenced main terminal 76 and out of the upper AC port 82 which is connected to the gate 74 via the collector-emitter path of transistor 34 while during negative AC alternations the current flow reverses.

It will be noticed from both embodiments of the invention that a single transistor amplifier comprising transistor 34 may be used in combination with a simple RC charging circuit 50 for providing sufficient gate current at its output to drive the trigger-type SCR or triac device into conduction in response to the base drive input signal via phototransistor 46 at the beginning of each AC alternation. The solid state optoelectronic coupler 36 for inhibiting base current drive to the transistor 34 when the relay 10 is deactuated and enabling it when actuated affords the electrical isolation between the AC switching path and the actuating control elements connected to the light-emitting diode 40. Despite the apparent simplicity of the circuit, the solid state relay of the invention still provides low power dissipation when deactuated (because of the large resistance for resistor 52) and rapid turn on times at the AC zero crossings for the trigger device when actuated.

Since the foregoing preferred embodiments can undoubtedly be modified by those skilled in the art without necessarily departing from the scope and spirit of the invention, the Detailed Description herein is intended to be merely exemplary and not restrictive of the invention which will now be claimed hereinbelow.

What is claimed is;

1. A solid state AC power relay comprising:
   bidirectional trigger switching means having two power terminals for passing AC current between an AC load and AC power source when triggered into conduction by a gate current during each AC alternation and a gate terminal for receiving said gate current;
   a pair of rectifying diodes, with commonly connected cathodes, connected in series between said power terminals;
   an optoelectronic coupler;
   a three terminal control element having a controllable current path between two of its terminals for passing said gate current between the AC power source and said gate terminal under the control of an input signal applied to its third terminal, said third terminal being connected to said commonly connected cathodes via the phototransistor of said coupler so that said input signal is enabled to flow therebetween only when the light emitting diode of said coupler is energized, and
   an RC charging circuit connected in series with said phototransistor between its collector and said commonly connected cathodes comprising a resistor in parallel with a series combination of a resistor and capacitor.

2. The relay of claim 1 wherein said trigger switching means includes a pair of oppositely poled SCR's connected in parallel between said two power terminals, and two diodes whose anodes are commonly connected to said gate terminal and each of whose cathodes is connected to a different one of the gates of said SCR's and said controllable current path is connected to the AC power source via said commonly connected cathodes.

3. The relay of claim 1 further including two diodes, with commonly connected anodes, connected in series between said power terminals and a zener diode whose anode and cathode are connected respectively to the aforesaid commonly connected anodes and the collector of said phototransistor.

4. The relay of claim 1 wherein said control element is a transistor.

5. The relay of claim 1 wherein said trigger switching means includes a triac whose main terminals are connected to said power terminals with said gate terminal being connected to the same AC power terminal as the triac non-referenced main terminal, and a full-wave rectifying bridge whose AC ports are connected to the triac gate and said gate terminal and whose DC ports are connected to said controllable current path.

6. A solid state AC power relay comprising:
   bidirectional trigger switching means having two power terminals for passing AC current between an AC load and AC power source when triggered into conduction by a gate current during each AC alternation and a gate terminal for receiving said gate current;
   a pair of rectifying diodes, with commonly connected cathodes, connected in series between said power terminals;
   an optoelectronic coupler;
   a three terminal control element having a controllable current path between two of its terminals for passing said gate current between the AC power source and said gate terminal under the control of an input signal applied to its third terminal, said third terminal being connected to said commonly connected cathodes via the phototransistor of said coupler so that said input signal is enabled to flow therebetween only when the light emitting diode of said coupler is energized, and
   two diodes, with commonly connected anodes, connected in series between said power terminals and a zener diode whose anode and cathode are connected respectively to the aforesaid commonly connected anodes and the collector of said phototransistor.

* * * * *